US011823626B2

(12) United States Patent
Kim et al.

(10) Patent No.: US 11,823,626 B2
(45) Date of Patent: Nov. 21, 2023

(54) SCAN DRIVER FOR A DISPLAY DEVICE WITH REDUCED DEGRADATION OF TRANSISTORS

(71) Applicant: Samsung Display Co., Ltd., Yongin-si (KR)

(72) Inventors: Jong Hee Kim, Yongin-si (KR); Soo Yeon Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/699,943

(22) Filed: Mar. 21, 2022

(65) Prior Publication Data
US 2022/0319436 A1 Oct. 6, 2022

Related U.S. Application Data

(62) Division of application No. 16/744,009, filed on Jan. 15, 2020, now Pat. No. 11,282,463.

(30) Foreign Application Priority Data

Jan. 30, 2019 (KR) .......................... 10-2019-0012204

(51) Int. Cl.
G09G 3/32 (2016.01)
G09G 3/3266 (2016.01)
G09G 3/36 (2006.01)

(52) U.S. Cl.
CPC ......... G09G 3/3266 (2013.01); G09G 3/3677 (2013.01); G09G 2310/08 (2013.01)

(58) Field of Classification Search
CPC .. G09G 3/3233; G09G 3/3266; G09G 3/3677; G09G 2310/0283; G09G 2310/08; G09G 2320/0233
See application file for complete search history.

(56) References Cited

U.S. PATENT DOCUMENTS 9,071,230 B2 6/2015 Kim et al.
9,685,948 B2 6/2017 Kim et al.
(Continued)

FOREIGN PATENT DOCUMENTS

KR 10-2020-0075141 7/2010
KR 10-2016-0053191 5/2016
(Continued)

OTHER PUBLICATIONS

Hong-Jae Shin, A Novel OLED Display Panel with High-Reliability Integrated Gate Driver Circuit using IGZO TFTs for Large-Sized UHD TVs, Journal, pp. 358-360, 28-2, OLED TV Development Group, LG Display Co., Paju-si, Republic of Korea.
(Continued)

Primary Examiner — Liliana Cerullo
(74) Attorney, Agent, or Firm — H.C. Park & Associates, PLC

(57) ABSTRACT

A scan driver for a display device includes a plurality of scan stage groups, each of the scan stage groups including a first scan stage and a second scan stage. The first scan stage includes: a first transistor including a gate electrode coupled to a first Q node, one electrode coupled to a first scan clock line, and another electrode coupled to a first scan line; a second transistor including a gate electrode and one electrode, which are coupled to a first scan carry line, and another electrode coupled to the first Q node; a third transistor including a gate electrode coupled to a first control line and one electrode coupled to a first sensing carry line; a fourth transistor including a gate electrode coupled to the other electrode of the third transistor, one electrode coupled to a second control line, and another electrode coupled to a first node; a first capacitor including one electrode coupled to the one electrode of the fourth transistor and another electrode coupled to the gate electrode of the fourth tran- (Continued)

sistor; a fifth transistor including a gate electrode coupled to a third control line, one electrode coupled to the first node, and another electrode coupled to the first Q node; and a sixth transistor including a gate electrode coupled to the first Q node, one electrode coupled to the second control line, and another electrode coupled to the first node.

1 Claim, 7 Drawing Sheets

(56) References Cited

U.S. PATENT DOCUMENTS

| | | | |
|---|---|---|---|
| 9,830,845 | B2 | 11/2017 | Lim et al. |
| 9,875,710 | B2 | 1/2018 | Kim et al. |
| 10,997,910 | B2 | 5/2021 | Hwang et al. |
| 11,227,552 | B2 * | 1/2022 | Kim ............ G09G 3/3233 |
| 2016/0217728 | A1 | 7/2016 | In et al. |
| 2016/0293094 | A1 | 10/2016 | Park et al. |
| 2017/0186394 | A1 | 6/2017 | Park et al. |
| 2018/0018921 | A1 | 1/2018 | Park et al. |
| 2018/0337682 | A1 | 11/2018 | Takasugi et al. |
| 2019/0019462 | A1 | 1/2019 | Kim et al. |
| 2020/0066211 | A1 | 2/2020 | Lee et al. |
| 2020/0184898 | A1 | 6/2020 | Choi et al. |
| 2020/0193912 | A1 | 6/2020 | Park et al. |
| 2020/0219451 | A1 | 7/2020 | Kim |
| 2020/0243018 | A1 | 7/2020 | Kim et al. |
| 2020/0372851 | A1 | 11/2020 | Kim et al. |
| 2021/0065617 | A1 | 3/2021 | Yang et al. |
| 2021/0158760 | A1 | 5/2021 | Jang |
| 2021/0366402 | A1 | 11/2021 | In et al. |

FOREIGN PATENT DOCUMENTS

| | | |
|---|---|---|
| KR | 10-2017-0026760 | 3/2017 |
| KR | 10-2017-0078978 | 7/2017 |
| KR | 10-2018-0007719 | 1/2018 |
| KR | 10-2018-0066375 | 6/2018 |
| KR | 10-2018-0128123 | 12/2018 |
| KR | 10-2019-0009019 | 1/2019 |
| KR | 10-2020-0085976 | 7/2020 |
| KR | 10-2020-0094895 | 8/2020 |
| KR | 10-2020-0135633 | 12/2020 |
| KR | 10-2021-0027576 | 3/2021 |

OTHER PUBLICATIONS

Kyung Min Kim, Bezel Free Design of Organic Light Emitting Diodes via a—InGaZnO Gate Driver Circuit Integration within Active Array, Journal, pp. 1-5, LG Display R&D Center, Seoul, Republic of Korea.

Final Office Action in U.S. Appl. No. 17/577,301, dated Dec. 8, 2022.

Notice of Allowance dated Feb. 23, 2023, in U.S. Appl. No. 17/577,301.

Corrected Notice of Allowability dated Mar. 21, 2023, in U.S. Appl. No. 17/577,301.

Shin, Hong-Jae, et al. "A Novel OLED Display Panel with HighReliability Integrated Gate Driver Circuit using IGZO TFTs for LargeSized UHD TVs." SID 2018 Digest, p. 358-361.

Hong-Jae Shin, A Novel OLED Display Panel with High-Reliability Integrated Gate Driver Circuit using IGZO TFTs for Large-Sized UHD TVs, Journal, pp. 358-360, 28-2, OLED TV Development Group, LG Display Co., Paju-si, Republic of Korea, 2018.

Kyung Min Kim, Bezel Free Design of Organic Light Emitting Diodes via a—InGaZnO Gate Driver Circuit Integration within Active Array, Journal, pp. 1-5, LG Display R&D Center, Seoul, Republic of Korea, 2023.

Non-Final Office Action dated Apr. 8, 2021, in U.S. Appl. No. 16/744,009.

Notice of Allowance dated Jul. 22, 2021, in U.S. Appl. No. 16/744,009.

Final Office Action dated Mar. 2, 2023, in U.S. Appl. No. 17/827,272.

Notice of Allowance dated Sep. 21, 2023 issued to KR Patent Application No. 10-2019-0012204.

* cited by examiner

<DISPLAY PERIOD>

SCAN DRIVER FOR A DISPLAY DEVICE WITH REDUCED DEGRADATION OF TRANSISTORS

CROSS-REFERENCE TO RELATED APPLICATIONS

This application is a Divisional of U.S. patent application Ser. No. 16/744,009, filed Jan. 15, 2020, which claims priority from and the benefit of Korean patent application 10-2019-0012204 filed on Jan. 30, 2019, which is hereby incorporated by reference for all purposes as if fully set forth herein.

BACKGROUND

Field

Embodiments of the invention relate generally to a display device, and more particular, to a scan driver included in the display device for outputting a scan signal and a sensing signal.

Discussion of the Background

With the development of information technologies, the importance of a display device which is a connection medium between a user and information has increased. Accordingly, display devices such as a liquid crystal display device, an organic light emitting display device, and plasma display devices are increasingly used.

Each pixel of a display device may emit light with a luminance corresponding to a data voltage input through a data line. The display device may display an image with a combination of light emitting pixels.

A plurality of pixels may be coupled to each data line. Therefore, a scan driver is required to provide a scan signal for selecting a pixel to which a data voltage is to be supplied among the plurality of pixels. The scan driver may be provided in the form of a shift register, to sequentially provide a turn-on level scan signal via a plurality of scan lines.

The above information disclosed in this Background section is only for understanding of the background of the inventive concepts, and, therefore, it may contain information that does not constitute prior art.

SUMMARY

Applicant discovered that a scan driver capable of selectively providing a turn-on level scan signal to only a desired scan line may be desirable, for example, so as to detect mobility information or threshold voltage information of a driving transistor of a pixel.

Scan drivers constructed according to the principles and illustrative implementations of the invention are capable of selectively providing a scan signal and minimizing or preventing degradation of transistors included in the scan driver.

Additional features of the inventive concepts will be set forth in the description which follows, and in part will be apparent from the description, or may be learned by practice of the inventive concepts.

According to an aspect of the invention, a scan driver includes: a plurality of scan stage groups, each of the scan stage groups including a first scan stage and a second scan stage, wherein the first scan stage s includes: a first transistor including a gate electrode coupled to a first Q node, one electrode coupled to a first scan clock line, and another electrode coupled to a first scan line; a second transistor including a gate electrode and one electrode, which are coupled to a first scan carry line, and another electrode coupled to the first Q node; a third transistor including a gate electrode coupled to a first control line and one electrode coupled to a first sensing carry line; a fourth transistor including a gate electrode coupled to the other electrode of the third transistor, one electrode coupled to a second control line, and another electrode coupled to a first node; a first capacitor including one electrode coupled to the one electrode of the fourth transistor and another electrode coupled to the gate electrode of the fourth transistor; a fifth transistor including a gate electrode coupled to a third control line, one electrode coupled to the first node, and another electrode coupled to the first Q node; and a sixth transistor including a gate electrode coupled to the first Q node, one electrode coupled to the second control line, and another electrode coupled to the first node.

The first scan stage may further include: a second capacitor including one electrode coupled to the gate electrode of the first transistor and another electrode coupled to the other electrode of the first transistor; a seventh transistor including a gate electrode coupled to the first Q node, one electrode coupled to a first sensing clock line, and another electrode coupled to a first sensing line; a third capacitor including one electrode coupled to the gate electrode of the seventh transistor and another electrode coupled to the other electrode of the seventh transistor; and an eighth transistor including a gate electrode coupled to the first Q node, one electrode coupled to a first carry clock line, and another electrode coupled to a first carry line.

The first scan stage may further include a ninth transistor including a gate electrode coupled to a first reset carry line, one electrode coupled to the first Q node, and another electrode coupled to a first power line.

The first scan stage may further include: a tenth transistor including a gate electrode coupled to a first QB node, one electrode coupled to the first Q node, and another electrode coupled to the first power line; and an eleventh transistor including a gate electrode coupled to a second QB node, one electrode coupled to the first Q node, and another electrode coupled to the first power line.

The first scan stage may further include: a twelfth transistor including a gate electrode coupled to the first QB node, one electrode coupled to the first carry line, and another electrode coupled to the first power line; a thirteenth transistor including a gate electrode coupled to the second QB node, one electrode coupled to the first carry line, and another electrode coupled to the first power line; a fourteenth transistor including a gate electrode coupled to the first QB node, one electrode coupled to the first sensing line, and another electrode coupled to a second power line; a fifteenth transistor including a gate electrode coupled to the second QB node, one electrode coupled to the first sensing line, and another electrode coupled to the second power line; a sixteenth transistor including a gate electrode coupled to the first QB node, one electrode coupled to the first scan line, and another electrode coupled to the second power line; and a seventeenth transistor including a gate electrode coupled to the second QB node, one electrode coupled to the first scan line, and another electrode coupled to the second power line.

The first scan stage may further include: an eighteenth transistor including a gate electrode coupled to a fourth control line, one electrode coupled to the first Q node, and another electrode coupled to the first power line; a nineteenth transistor including a gate electrode coupled to the first Q node, one electrode coupled to the first power line, and another electrode coupled to the first QB node; and a twentieth transistor including a gate electrode coupled to the first scan carry line, one electrode coupled to the first power line, and another electrode coupled to the first QB node.

The first scan stage may further include: a twenty-first transistor including a gate electrode coupled to the other electrode of the third transistor and one electrode coupled to the first power line; and a twenty-second transistor including a gate electrode coupled to the third control line, one electrode coupled to the other electrode of the twenty-first transistor, and another electrode coupled to the first QB node.

The first scan stage may further include: a twenty-third transistor including a gate electrode and one electrode, which are coupled to a fifth control line; and a twenty-fourth transistor including a gate electrode coupled to the other electrode of the twenty-third transistor, one electrode coupled to the fifth control line, and another electrode coupled to the first QB node.

The first scan stage may further include: a twenty-fifth transistor including a gate electrode coupled to the first Q node, one electrode coupled to the gate electrode of the twenty-fourth transistor, and another electrode coupled to a third power line; and a twenty-sixth transistor including a gate electrode coupled to a second Q node, one electrode coupled to the gate electrode of the twenty-fourth transistor, and another electrode coupled to the third power line.

The third transistor may include: a first sub-transistor including a gate electrode coupled to the first control line and one electrode coupled to the first sensing carry line; and a second sub-transistor including a gate electrode coupled to the first control line, one electrode coupled to the other electrode of the first sub-transistor, and another electrode coupled to the other electrode of the first capacitor. The first scan stage may further include a twenty-seventh transistor including a gate electrode coupled to the other electrode of the second sub-transistor, one electrode coupled to the one electrode of the second sub-transistor, and another electrode coupled to the second control line.

The second scan stage may include: an twenty-eighth transistor including a gate electrode coupled to the second Q node, one electrode coupled to a second scan line, and another electrode coupled to a second scan clock line; a fourth capacitor coupling the gate electrode and the one electrode of the twenty-eighth transistor to each other; a twenty-ninth transistor including a gate electrode coupled to the second Q node, one electrode coupled to a second sensing line, and another electrode coupled to a second sensing clock line; a fifth capacitor coupling the gate electrode and the one electrode of the twenty-ninth transistor to each other; and a thirtieth transistor including a gate electrode coupled to the second Q node, one electrode coupled to a second carry line, and another electrode coupled to a second carry clock line.

The second scan stage may further include: a thirty-first transistor including a gate electrode coupled to the first QB node, one electrode coupled to the first power line, and another electrode coupled to the second Q node; and a thirty-second transistor including a gate electrode coupled to the second QB node, one electrode coupled to the first power line, and another electrode coupled to the second Q node.

The second scan stage may further include: a thirty-third transistor including a gate electrode, one electrode, and the other electrode, wherein the gate electrode and another electrode coupled to a sixth control line; a thirty-fourth transistor including a gate electrode coupled to the one electrode of the thirty-third transistor, one electrode coupled to the second QB node, and another electrode coupled to the sixth control line; a thirty-fifth transistor including a gate electrode coupled to the first Q node, one electrode coupled to the third power line, and another electrode coupled to the gate electrode of the thirty-fourth transistor; and a thirty-sixth transistor including a gate electrode coupled to the second Q node, one electrode coupled to the third power line, and another electrode coupled to the gate electrode of the thirty-fourth transistor.

The second scan stage may further include: a thirty-seventh transistor including a gate electrode coupled to the first QB node, one electrode coupled to the first power line, and another electrode coupled to the second carry line; a thirty-eighth transistor including a gate electrode coupled to the second QB node, one electrode coupled to the first power line, and another electrode coupled to the second carry line; a thirty-ninth transistor including a gate electrode coupled to the first QB node, one electrode coupled to the second power line, and another electrode coupled to the second sensing line; a fortieth transistor including a gate electrode coupled to the second QB node, one electrode coupled to the second power line, and another electrode coupled to the second sensing line; a forty-first transistor including a gate electrode coupled to the first QB node, one electrode coupled to the second power line, and another electrode coupled to the second scan line; and a forty-second transistor including a gate electrode coupled to the second QB node, one electrode coupled to the second power line, and another electrode coupled to the second scan line.

The second scan stage may further include: a forty-third transistor including a gate electrode coupled to the first control line, one electrode coupled to a second sensing carry line, and another electrode coupled to a second node; a forty-fourth transistor including a gate electrode coupled to the third control line, one electrode coupled to the second Q node, and another electrode coupled to the second node; a forty-fifth transistor including a gate electrode coupled to the other electrode of the forty-third transistor, one electrode coupled to the second node, and another electrode coupled to the second control line; and a sixth capacitor including one electrode coupled to the gate electrode of the forty-fifth transistor and another electrode coupled to the other electrode of the forty-fifth transistor.

The second scan stage may further include: a forty-sixth transistor including one electrode coupled to the second Q node and a gate electrode and another electrode, which are coupled to a second scan carry line; and a forty-seventh transistor including a gate electrode coupled to the second Q node, one electrode coupled to the second control line, and another electrode coupled to the second node.

The second scan stage may further include: a forty-eighth transistor including a gate electrode coupled to the other electrode of the forty-third transistor and one electrode coupled to the first power line; and a forty-ninth transistor including a gate electrode coupled to the third control line, one electrode coupled to the other electrode of the forty-eighth transistor, and another electrode coupled to the second QB node.

The second scan stage may further include: a fiftieth transistor including a gate electrode coupled to the second Q node, one electrode coupled to the second QB node, and the other electrode coupled to the first power line; and a fifty-first transistor including a gate electrode coupled to the first scan carry line, one electrode coupled to the second QB node, and the other electrode coupled to the first power line.

The second scan stage may further include: a fifty-second transistor including a gate electrode coupled to the fourth control line, one electrode coupled to the first power line, and another electrode coupled to the second Q node; and a fifty-third transistor including a gate electrode coupled to the first reset carry line, one electrode coupled to the first power line, and another electrode coupled to the second Q node.

The forty-third transistor may include: a first sub-transistor including a gate electrode coupled to the first control line and one electrode coupled to the second sensing carry line; and a second sub-transistor including a gate electrode coupled to the first control line, one electrode coupled to the other electrode of the first sub-transistor, and the other electrode coupled to the gate electrode of the forty-fifth transistor. The second scan stage may further include a fifty-fourth transistor including a gate electrode coupled to the other electrode of the second sub-transistor, one electrode coupled to the second control line, and another electrode coupled to the one electrode of the second sub-transistor.

According to another aspect of the invention, a scan driver includes: a plurality of scan stage groups, each of the scan stage groups including a first scan stage and a second scan stage, wherein the first scan stage includes: a first transistor including a gate electrode coupled to a first Q node, one electrode coupled to a first scan clock line, and another electrode coupled to a first scan line; a second transistor including a gate electrode and one electrode, which are coupled to a first scan carry line, and another electrode coupled to the first Q node; a third transistor including a gate electrode coupled to a first control line and one electrode coupled to a first sensing carry line; a fourth transistor including a gate electrode coupled to the other electrode of the third transistor, one electrode coupled to a second control line, and another electrode coupled to a first node; a first capacitor including one electrode coupled to the one electrode of the fourth transistor and another electrode coupled to the gate electrode of the fourth transistor; and a fifth transistor including a gate electrode coupled to a third control line, one electrode coupled to the first node, and another electrode coupled to the first Q node, wherein the first node is coupled to a first carry line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1:
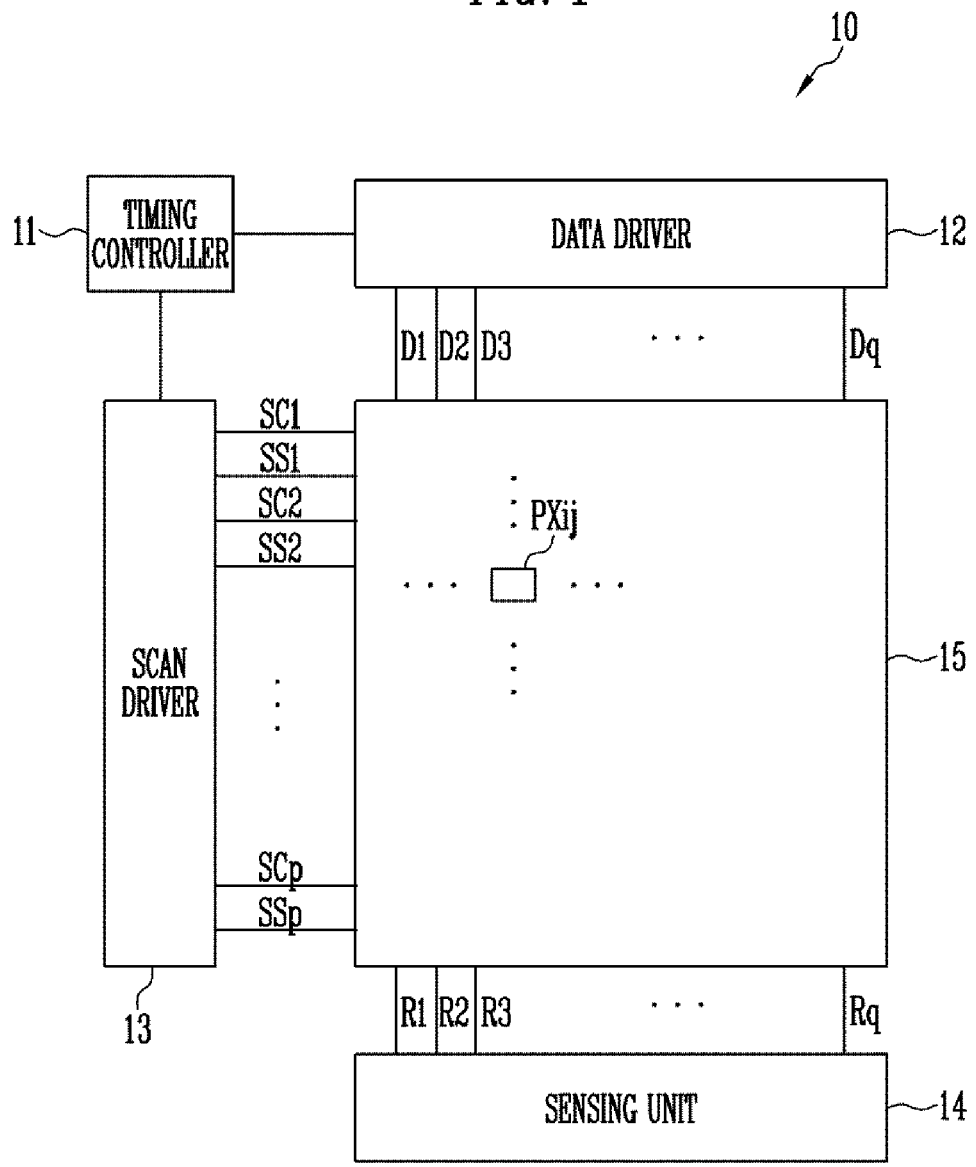
FIG. 1 is a block diagram of an embodiment of a display device constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z—axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a block diagram of an embodiment of a display device constructed according to the principles of the invention.

Referring to FIG. 1, the display device 10 according to the embodiment may include a timing controller 11, a data driver 12, a scan driver 13, a sensing unit 14, and a pixel unit 15.

The timing controller 11 may provide grayscale values, a control signal, and the like to the data driver 12. Also, the timing controller 11 may provide a clock signal, a control signal, and the like to each of the scan driver 13 and the sensing unit 14.

The data driver 12 may generate data signals to be provided to data lines D1, D2, D3, . . . , and Dq, using the grayscale values, the control signal, and the like, which are received from the timing controller 11. For example, the data driver 12 may sample grayscale values, using a clock signal, and apply data signals corresponding to the grayscale values to the data lines D1 to Dq in units of pixel rows. Here, q may be an integer that is not 0.

The scan driver 13 may generate scan signals to be provided to scan lines SC1, SC2, . . . , and SCp by receiving the clock signal, the control signal, and the like from the timing controller 11. For example, one frame may include one display period and one sensing period, and the scan driver 13 may sequentially provide scan signals having a turn-on level pulse to the scan lines SC1 to SCp during the display period. For example, the scan driver 13 may generate the scan signals in a manner that sequentially transfers a turn-on level pulse to a next scan stage in response to the clock signal. Here, p may be an integer that is not 0. For example, the scan driver 13 may be configured in a shift register form.

Also, the scan driver 13 may generate sensing signals to be provided to sensing lines SS1, SS2, . . . , and SSp. For example, the scan driver 13 may sequentially provide sensing signals having a turn-on level pulse to the sensing lines SS1 to SSp during the display period. For example, the scan driver 13 may generate the sensing signals in a manner than sequentially transfer a turn-on level pulse to a next stage in response to the clock signal.

Figure 4:
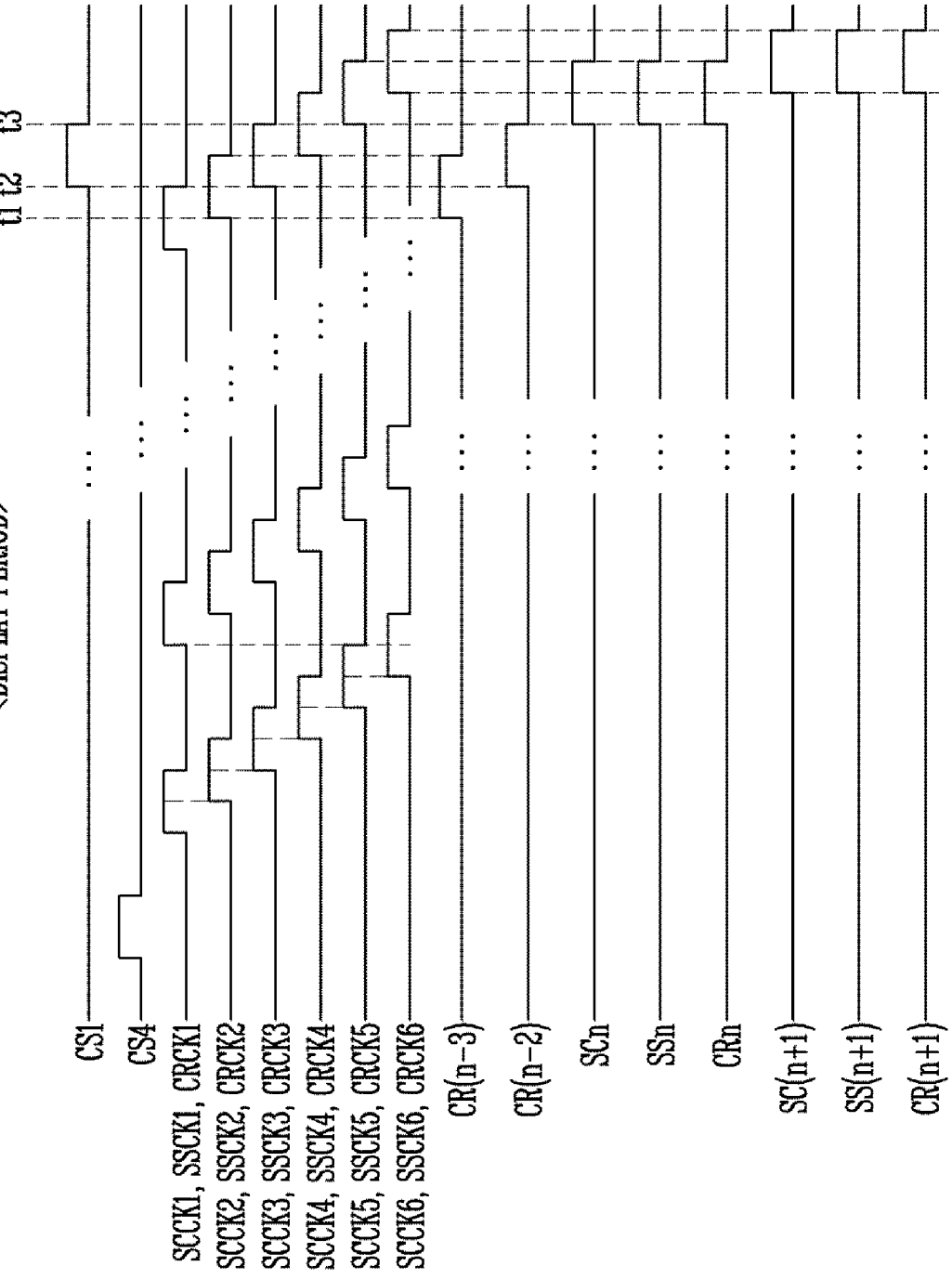
FIG. 4 is an exemplary timing diagram illustrating an example of an operation in a display period of the first scan stage and the second scan stage shown in FIG. 3.
Figure 7:
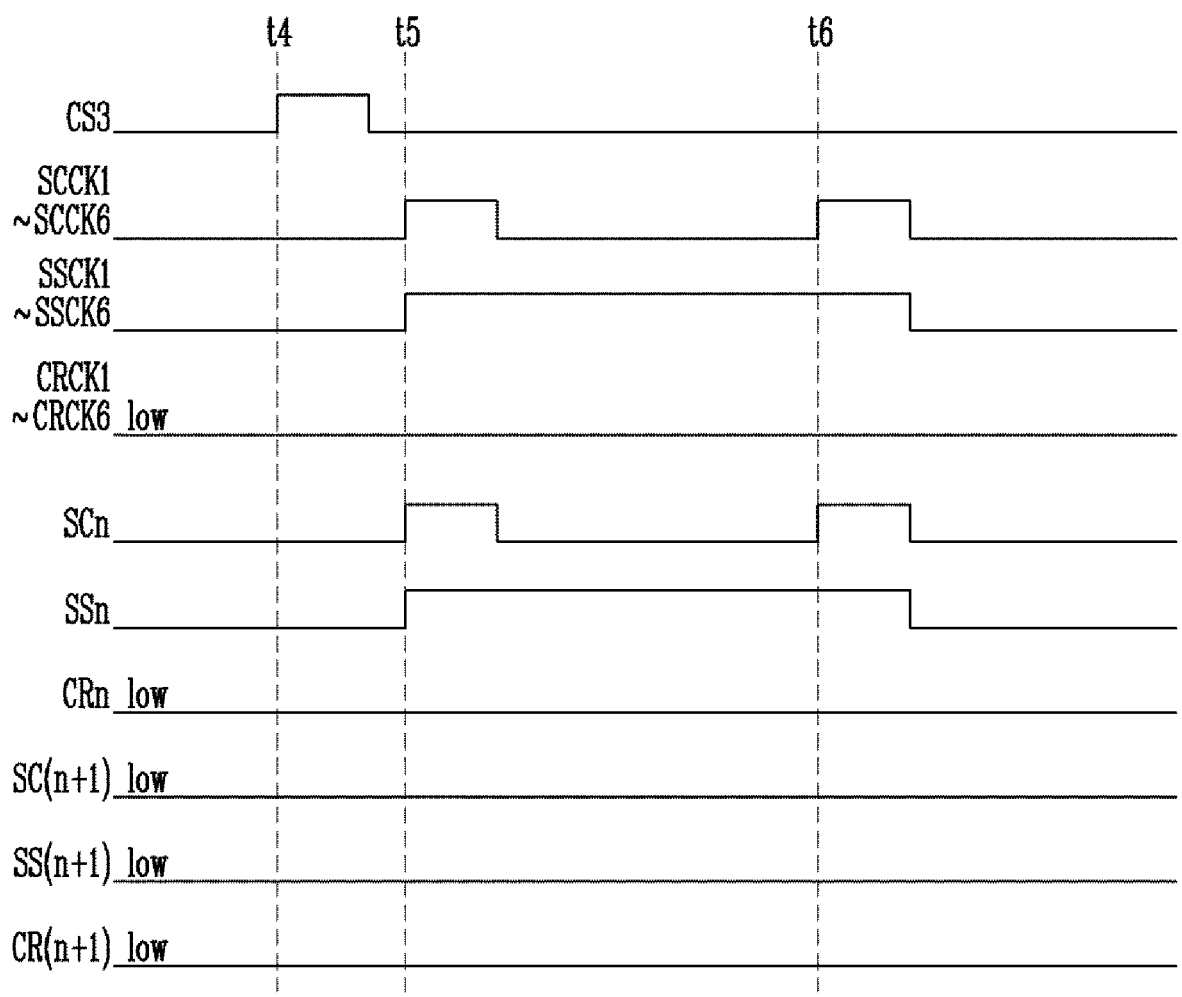
FIG. 7 is an exemplary timing diagram illustrating an example of an operation in a sensing period of the first scan stage and the second scan stage shown in FIG. 3.

An operation of the scan driver 13 related to the display period is shown in FIG. 4, and an operation in a sensing period is shown in FIG. 7 and will be separately described.

The sensing unit 14 may measure degradation information of pixels according to currents or voltages received through receiving lines R1, R2, R3, . . . , Rq. For example, the degradation information of pixels may be mobility information of driving transistors, threshold voltage information, degradation information of light emitting devices, etc. Also, the sensing unit 14 may measure characteristic information of pixels, which is changed depending on the environment, according to the currents or voltages received through the receiving lines R1 to Rq. For example, the sensing unit 14 may measure characteristic information of pixels, which is changed depending on temperature or humidity.

The pixel unit 15 includes pixels. Each pixel PXij may be coupled to a corresponding data line, a corresponding scan line, a corresponding sensing line, and a corresponding receiving line. Here, i and j may be integers that are not 0. The pixel PXij may mean a pixel circuit including a scan transistor coupled to an ith scan line and a jth data line.

Figure 2:
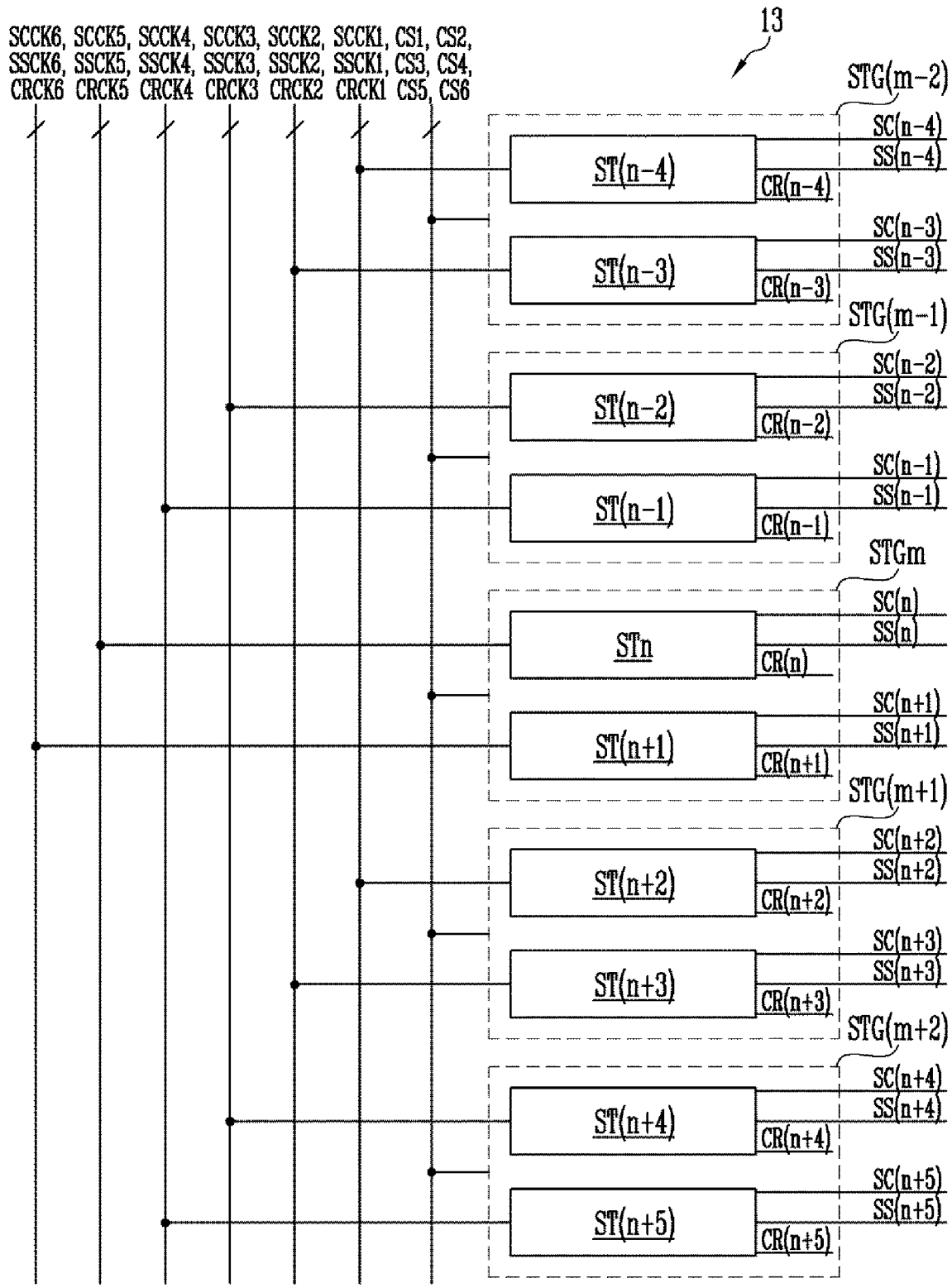
FIG. 2 is a block diagram of an embodiment of a scan driver constructed according to the principles of the invention.

FIG. 2 is a block diagram of an embodiment of a scan driver constructed according to the principles of the invention.

Referring to FIG. 2, the scan driver 13 includes a plurality of stage groups STGm. In FIG. 2, only a portion of the scan driver 13 such as STG(m−2), STG(m−1), STGm, STG(m+1), STG(m+2), which is necessary for description, is illustrated.

Each of the stage groups STG(m−2) to STG(m+2) of the scan driver 13 may include a first scan stage and a second scan stage. The first scan stage may be an odd-numbered scan stage, and the second scan stage may be an even-numbered scan stage. For example, the (m−2)$^{th}$ stage group STG(m−2) may include a first scan stage ST(n−4) and a second scan stage ST(n−3), the (m−1)$^{th}$ stage group STG (m−1) may include a first scan stage ST(n−2) and a second scan stage ST(n−1), the m$^{th}$ stage group STGm may include a first scan stage STn and a second scan stage ST(n+1), the (m+1)$^{th}$ stage group STG(m+1) may include a first scan stage ST(n+2) and a second scan stage ST(n+3), and the (m+2)$^{th}$ stage group STG(m+2) may include a first scan stage ST(n+4) and a second scan stage ST(n+5). Here, m and n may be integers that are not 0.

Each of the scan stages ST(n−4) to ST(n+5) may be coupled to first to sixth control lines CS1, CS2, CS3, CS4, CS5, and CS6. Common control signals may be applied to the scan stages ST(n−4) to ST(n+5) through the first to sixth control lines CS1, CS2, CS3, CS4, CS5, and CS6.

Each of the scan stages ST(n−4) to ST(n+5) may be coupled to corresponding input clock lines among scan clock lines SCCK1, SCCK2, SCCK3, SCCK4, SCCK5, and SCCK6, sensing clock lines SSCK1, SSCK2, SSCK3, SSCK4, SSCK5, and SSCK6, and carry clock lines CRCK1, CRCK2, CRCK3, CRCK4, CRCK5, and CRCK6.

For example, the first scan stage ST(n−4) of the (m−2)$^{th}$ stage group STG(m−2) may be coupled to a scan clock line SCCK1, a sensing clock line SSCK1, and a carry clock line CRCK1, and the second scan stage ST(n−3) of the (m−2)$^{th}$ stage group STG(m−2) may be coupled to a scan clock line SCCK2, a sensing clock line SSCK2, and a carry clock line CRCK2. The first scan stage ST(n−2) of the (m−1)$^{th}$ stage group STG(m−2) may be coupled to a scan clock line SCCK3, a sensing clock line SSCK3, and a carry clock line CRCK3, and the second scan stage ST(n−1) of the (m−1)$^{th}$ stage group STG(m−2) may be coupled to a scan clock line SCCK4, a sensing clock line SSCK4, and a carry clock line CRCK4. The first scan stage STn of the m$^{th}$ stage group STGm may be coupled to a scan clock line SCCK5, a sensing clock line SSCK5, and a carry clock line CRCK5, and the second scan stage ST(n+1) of the m$^{th}$ stage group STGm may be coupled to a scan clock signal SCCK6, a sensing clock line SSCK6, and a carry clock line CRCK6.

In addition, iteratively, the first scan stage ST(n+2) of the (m+1)$^{th}$ stage group STG(m+1) may be coupled to the scan clock line SCCK1, the sensing clock line SSCK1, and the carry clock line CRCK1, and the second scan stage ST(n+3) of the (m+1)$^{th}$ stage group STG(m+1) may be coupled to the scan clock line SCCK2, the sensing clock line SSCK2, and the carry clock line CRCK2. The first scan stage ST(n+4) of the (m+2)$^{th}$ stage group STG(m+2) may be coupled to the scan clock line SCCK3, the sensing clock line SSCK3, and the carry clock line CRCK3, and the second scan stage ST(n+5) of the (m+2)$^{th}$ stage group STG(m+2) may be coupled to the scan clock line SCCK4, the sensing clock line SSCK4, and the carry clock line CRCK4.

Input signals for the respective scan stages ST(n−4) to ST(n+5) are applied through the first to sixth control lines CS1 to CS6, the scan clock lines SCCK1 to SCCK6, the sensing clock lines SSCK1 to SSCK6, and the carry clock lines CRCK1 to CRCK6.

Each of the scan stages ST(n−4) to ST(n+5) may be coupled to corresponding output lines among scan lines SC(n−4), SC(n−3), SC(n−2), SC(n−1), SCn, SC(n+1), SC(n+2), SC(n+3), SC(n+4), and SC(n+5), sensing lines SS(n−4), SS(n−3), SS(n−2), SS(n−1), SSn, SS(n+1), SS(n+2), SS(n+3), SS(n+4), and SS(n+5), and carry lines CR(n−4), CR(n−3), CR(n−2), CR(n−1), CRn, CR(n+1), CR(n+2), CR(n+3), CR(n+4), and CR(n+5).

For example, the first scan stage ST(n−4) of the (m−2)$^{th}$ stage group STG(m−2) may be coupled to a scan line SC(n−4), a sensing line SS(n−4), and a carry line CR(n−4), and the second scan stage ST(n−3) of the (m−2)$^{th}$ stage group STG(m−2) may be coupled to a scan line SC(n−3), a sensing line SS(n−3), and a carry line CR(n−3). The first scan stage ST(n−2) of the (m−1)$^{th}$ stage group STG(m−2) may be coupled to a scan line SC(n−2), a sensing line SS(n−2), and a carry line CR(n−2), and the second scan stage ST(n−1) of the (m−1)$^{th}$ stage group STG(m−2) may be coupled to a scan line SC(n−1), a sensing line SS(n−1), and a carry line CR(n−1). The first scan stage STn of the m$^{th}$ stage group STGm may be coupled to a scan line SCn, a sensing line SSn, and a carry line CRn, and the second scan stage ST(n+1) of the m$^{th}$ stage group STGm may be coupled to a scan line SC(n+1), a sensing line SS(n+1), and a carry line CR(n+1). The first scan stage ST(n+2) of the (m+1)$^{th}$ stage group STG(m+1) may be coupled to a scan line SC(n+2), a sensing line SS(n+2), and a carry line CR(n+2), and the second scan stage ST(n+3) of the (m+1)$^{th}$ stage group STG(m+1) may be coupled to a scan line SC(n+3), a sensing line SS(n+3), and a carry line CR(n+3). The first scan stage ST(n+4) of the (m+2)$^{th}$ stage group STG(m+2) may be coupled to a scan line SC(n+4), a sensing line SS(n+4), and a carry line CR(n+4), and the second scan stage ST(n+5) of the (m+2)$^{th}$ stage group STG(m+2) may be coupled to a scan line SC(n+5), a sensing line SS(n+5), and a carry line CR(n+5).

Output signals generated by the respective scan stages ST(n−4) to ST(n+5) are outputted through the scan lines SC(n−4) to SC(n+5), the sensing lines SS(n−4) to SS(n+5), and the carry lines CR(n−4) to CR(n+5).

Figure 3:
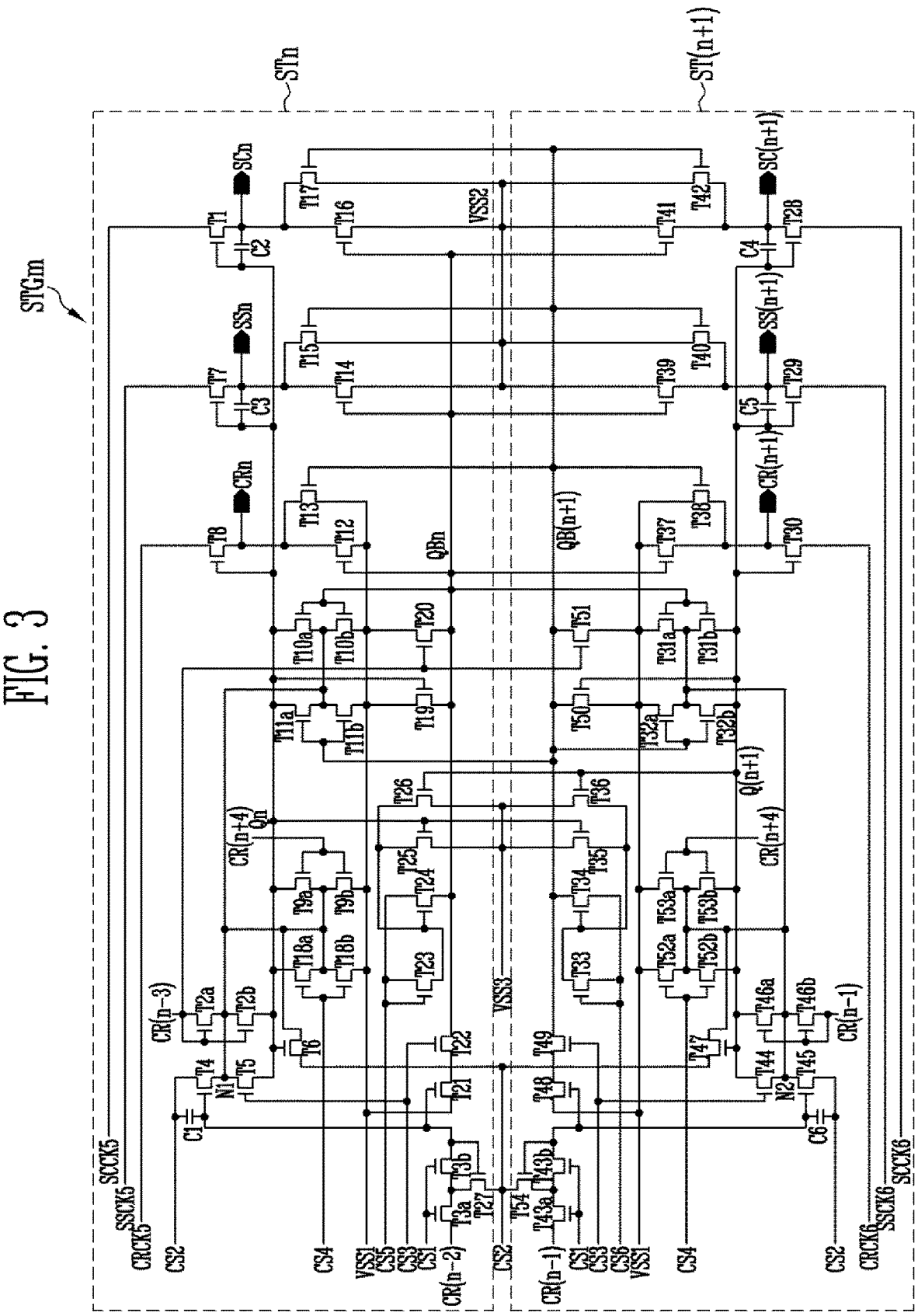
FIG. 3 is a circuit diagram of an embodiment of a first scan stage and a second scan stage included in a stage group of the scan driver shown in FIG. 2.

FIG. 3 is a circuit diagram of an embodiment of a first scan stage and a second scan stage included in a stage group of the scan driver shown in FIG. 2.

Referring to FIG. 3, the m$^{th}$ stage group STm including the first scan stage STn and the second scan stage ST(n+1) is illustrated. Each of the other stage groups shown in FIG. 2 includes a configuration substantially identical to that shown in FIG. 3, and therefore, repetitive descriptions will be omitted to avoid redundancy.

First, the first scan stage STn of the m$^{th}$ stage group STGm may include transistors T1 to T27 and capacitors C1 to C3, and the second scan stage ST(n+1) of the m$^{th}$ stage group STGm may include transistors T28 to T54 and capacitors C4 to C6. Hereinafter, a case where transistors T1 to T54 are implemented with an N-type transistor (e.g., an NMOS transistor) is assumed and described, but those skilled in the art may implement the stage group STGm by replacing some or all of the transistors T1 to T54 with a P-type transistor (e.g., a PMOS transistor).

A gate electrode of a first transistor T1 may be coupled to a first Q node Qn, one electrode of the first transistor T1 may be coupled to a first scan clock line SCCK5, and the other electrode of the first transistor T1 may be coupled to a first scan line SCn.

A gate electrode and one electrode of a second transistor may be coupled to a first scan carry line CR(n−3), and the other electrode of the second transistor may be coupled to the first Q node Qn. For example, a carry signal output from the scan stage ST(n−3) may be applied to the first scan carry line CR(n−3). In some embodiments, the second transistor may include two second sub-transistors T2a and T2b coupled in series. A gate electrode and one electrode of the first-second sub-transistor T2a may be coupled to the first scan carry line CR(n−3), and the other electrode of the first-second sub-transistor T2a may be coupled to a first node N1. A gate electrode of the second-second sub-transistor T2b may be coupled to the first scan carry line CR(n−3), one electrode of the second-second sub-transistor T2b may be coupled to the first node N1, and the other electrode of the second-second sub-transistor T2b may be coupled to the first Q node Qn.

A gate electrode of a third transistor may be coupled to the first control line CS1, one electrode of the third transistor may be coupled to a first sensing carry line CR(n−2), and the other electrode of the third transistor may be coupled to the other electrode of a first capacitor C1. In some embodiments, the third transistor may include two third sub-transistors T3a and T3b coupled in series. A gate electrode of the first-third sub-transistor T3a may be coupled to the first control line CS1, one electrode of the first-third sub-transistor T3a may be coupled to the first sensing carry line CR(n−2), and the other electrode of the first-third sub-transistor T3a may be coupled to one electrode of the second-third sub-transistor T3b. A gate electrode of the second-third sub-transistor T3b may be coupled to the first control line CS1, the one electrode of the second-third sub-transistor T3b may be coupled to the other electrode of the first-third sub-transistor T3a, and the other electrode of the second-third sub-transistor T3b may be coupled to the other electrode of the first capacitor C1.

A gate electrode of a fourth transistor T4 may be coupled to the other electrode of the third transistor, one electrode of the fourth transistor T4 may be coupled to the second control line CS2, and the other electrode of the fourth transistor T4 may be coupled to the first node N1.

One electrode of the first capacitor C1 may be coupled to the one electrode of the fourth transistor T4, and the other electrode of the first capacitor C1 may be coupled to the gate electrode of the fourth transistor T4.

A gate electrode of a fifth transistor T5 may be coupled to the third control line CS3, one electrode of the fifth transistor T5 may be coupled to the first node N1, and the other electrode of the fifth transistor T5 may be coupled to the first Q node Qn.

A gate electrode of a sixth transistor T6 may be coupled to the first Q node Qn, one electrode of the sixth transistor T6 may be coupled to the second control line CS2, and the other electrode of the sixth transistor T6 may be coupled to the first node N1.

One electrode of a second capacitor C2 may be coupled to the gate electrode of the first transistor T1, and the other electrode of the second capacitor C2 may be coupled to the other electrode of the first transistor T1.

A gate electrode of a seventh transistor T7 may be coupled to the first Q node Qn, one electrode of the seventh transistor T7 may be coupled to a first sensing clock line SSCK5, and the other electrode of the seventh transistor T7 may be coupled to a first sensing line SSn.

One electrode of a third capacitor C3 may be coupled to the gate electrode of the seventh transistor T7, and the other electrode of the third capacitor C3 may be coupled to the other electrode of the seventh transistor T7.

A gate electrode of an eighth transistor T8 may be coupled to the first Q node Qn, one electrode of the eighth transistor T8 may be coupled to a first carry clock line CRCK5, and the other electrode of the eighth transistor T8 may be coupled to a first carry line CRn.

A gate electrode of a ninth transistor may be coupled to a first reset carry line CR(n+4), one electrode of the ninth transistor may be coupled to the first Q node Qn, and the other electrode of the ninth transistor may be coupled to a first power line VSS1. For example, a carry signal output from the scan stage ST(n+4) may be applied to the first reset carry line CR(n+4). In some embodiments, the ninth transistor may include two ninth sub-transistors T9a and T9b coupled in series. A gate electrode of the first-ninth sub-transistor T9a may be coupled to the first reset carry line CR(n+4), one electrode of the first-ninth sub-transistor T9a may be coupled to the first Q node Qn, and the other electrode of the first-ninth sub-transistor T9a may be coupled to the first node N1. A gate electrode of the second-ninth sub-transistor T9b may be coupled to the first reset carry line CR(n+4), one electrode of the second-ninth sub-transistor T9b may be coupled to the first node N1, and the other electrode of the second-ninth sub-transistor T9b may be coupled to the first power line VSS1.

A gate electrode of a tenth transistor may be coupled to a first QB node QBn, one electrode of the tenth transistor may be coupled to the first Q node Qn, and the other electrode of the tenth transistor may be coupled to the first power line VSS1. In some embodiments, the tenth transistor may include two tenth sub-transistors T10a and T10b coupled in series. A gate electrode of the first-tenth sub-transistor T10a may be coupled to the first QB node QBn, one electrode of the first-tenth sub-transistor T10a may be coupled to the first Q node Qn, and the other electrode of the first-tenth sub-transistor T10a may be coupled to the first node N1. A gate electrode of the second-tenth sub-transistor T10b may be coupled to the first QB node QBn, one electrode of the second-tenth sub-transistor T10b may be coupled to the first node N1, and the other electrode of the second-tenth sub-transistor T10b may be coupled to the first power line VSS1.

A gate electrode of an eleventh transistor may be coupled to a second QB node QB(n+1), one electrode of the eleventh transistor may be coupled to the first Q node Qn, and the other electrode of the eleventh transistor may be coupled to the first power line VSS1. In some embodiments, the eleventh transistor may include two eleventh sub-transistors T11a and T11b coupled in series. A gate electrode of the first-eleventh sub-transistor T11a may be coupled to the second QB node QB(n+1), one electrode of the first-eleventh sub-transistor T11a may be coupled to the first Q node Qn, and the other electrode of the first-eleventh sub-transistor T11a may be coupled to the first node N1. A gate electrode of the second-eleventh sub-transistor T11b may be coupled to the second QB node QB(n+1), one electrode of the second-eleventh sub-transistor T11b may be coupled to the first node N1, and the other electrode of the second-eleventh sub-transistor T11b may be coupled to the first power line VSS1.

A gate electrode of a twelfth transistor T12 may be coupled to the first QB node QBn, one electrode of the twelfth transistor T12 may be coupled to the first carry line CRn, and the other electrode of the twelfth transistor T12 may be coupled to the first power line VSS1.

A gate electrode of a thirteenth transistor T13 may be coupled to the second QB node QB(n+1), one electrode of the thirteenth transistor T13 may be coupled to the first carry line CRn, and the other electrode of the thirteenth transistor T13 may be coupled to the first power line VSS1.

A gate electrode of a fourteenth transistor T14 may be coupled to the first QB node QBn, one electrode of the fourteenth transistor T14 may be coupled to the first sensing line SSn, and the other electrode of the fourteenth transistor T14 may be coupled to a second power line VSS2.

A gate electrode of a fifteenth transistor T15 may be coupled to the second QB node QB(n+1), one electrode of the fifteenth transistor T15 may be coupled to the first sensing line SSn, and the other electrode of the fifteenth transistor T15 may be coupled to the second power line VSS2.

A gate electrode of a sixteenth transistor T16 may be coupled to the first QB node QBn, one electrode of the sixteenth transistor T16 may be coupled to the first scan line SCn, and the other electrode of the sixteenth transistor T16 may be coupled to the second power line VSS2.

A gate electrode of a seventeenth transistor T17 may be coupled to the second QB node QB(n+1), one electrode of the seventeenth transistor T17 may be coupled to the first scan line SCn, and the other electrode of the seventeenth transistor T17 may be coupled to the second power line VSS2.

A gate electrode of an eighteenth transistor may be coupled to the fourth control line CS4, one electrode of the eighteenth transistor may be coupled to the first Q node Qn, and the other electrode of the eighteenth transistor may be coupled to the first power line VSS1. In some embodiments, the eighteenth transistor may include two eighteenth sub-transistors T18$a$ and T18$b$ coupled in series. A gate electrode of the first-eighteenth sub-transistor T18$a$ may be coupled to the fourth control line CS4, one electrode of the first-eighteenth sub-transistor T18$a$ may be coupled to the first Q node Qn, and the other electrode of the first-eighteenth sub-transistor T18$a$ may be coupled to the first node N1. A gate electrode of the second-eighteenth sub-transistor T18$b$ may be coupled to the fourth control line CS4, one electrode of the second-eighteenth sub-transistor T18$b$ may be coupled to the first node N1, and the other electrode of the second-eighteenth sub-transistor T18$b$ may be coupled to the first power line VSS1.

A gate electrode of a nineteenth transistor T19 may be coupled to the first Q node Qn, one electrode of the nineteenth transistor T19 may be coupled to the first power line VSS1, and the other electrode of the nineteenth transistor T19 may be coupled to the first QB node QBn.

A gate electrode of the twentieth transistor T20 may be coupled to the first scan carry line CR(n−3), one electrode of the twentieth transistor T20 may be coupled to the first power line VSS1, and the other electrode of the twentieth transistor T20 may be coupled to the first QB node QBn.

A gate electrode of a twenty-first transistor T21 may be coupled to the other electrode of the third transistor (i.e., second-third sub-transistor T3$b$), one electrode of the twenty-first transistor T21 may be coupled to the first power line VSS1, and the other electrode of the twenty-first transistor T21 may be coupled to one electrode of a twenty-second transistor T22.

A gate electrode of the twenty-second transistor T22 may be coupled to the third control line CS3, the one electrode of the twenty-second transistor T22 may be coupled to the other electrode of the twenty-first transistor T21, and the other electrode of the twenty-second transistor T22 may be coupled to the first QB node QBn.

A gate electrode and one electrode of a twenty-third transistor T23 may be coupled to the fifth control line CS5, and the other electrode of the twenty-third transistor T23 may be coupled to a gate electrode of a twenty-fourth transistor T24.

The gate electrode of the twenty-fourth transistor T24 may be coupled to the other electrode of the twenty-third transistor T23, one electrode of the twenty-fourth transistor T24 may be coupled to the fifth control line CS5, and the other electrode of the twenty-fourth transistor T24 may be coupled to the first QB node QBn.

A gate electrode of a twenty-fifth transistor T25 may be coupled to a first Q node Qn, one electrode of the twenty-fifth transistor T25 may be coupled to the gate electrode of the twenty-fourth transistor T24, and the other electrode of the twenty-fifth transistor T25 may be coupled to a third power line VSS3.

A gate electrode of a twenty-sixth transistor T26 may be coupled to a second Q node Q(n+1), one electrode of the twenty-sixth transistor T26 may be coupled to the gate electrode of the twenty-fourth transistor T24, and the other electrode of the twenty-sixth transistor T26 may be coupled to the third power line VSS3.

A gate electrode of a twenty-seventh transistor T27 may be coupled to the other electrode of the second-third sub-transistor T3$b$, one electrode of the twenty-seventh transistor T27 may be coupled to one electrode of the second-third sub-transistor T3$b$, and the other electrode of the twenty-seventh transistor T27 may be coupled to the second control line CS2.

Next, the second scan stage ST(n+1) may include transistors T28 to T54 and capacitors C4 to C6.

A gate electrode of a twenty-eighth transistor T28 may be coupled to the second Q node Q(n+1), one electrode of the twenty-eighth transistor T28 may be coupled to a second scan line SC(n+1), and the other electrode of the twenty-eighth transistor T28 may be a second scan clock line SCCK6.

A fourth capacitor C4 may couple the gate electrode and the one electrode of the twenty-eighth transistor T28 to each other.

A gate electrode of a twenty-ninth transistor T29 may be coupled to the second Q node Q(n+1), one electrode of the twenty-ninth transistor T29 may be coupled to a second sensing line SS(n+1), and the other electrode of the twenty-ninth transistor T29 may be coupled to a second sensing clock line SSCK6.

A fifth capacitor C5 may couple the gate electrode and the one electrode of the twenty-ninth transistor T29 to each other.

A gate electrode of a thirtieth transistor T30 may be coupled to the second Q node Q(n+1), one electrode of the thirtieth transistor T30 may be coupled to a second carry line CR(n+1), and the other electrode of the thirtieth transistor T30 may be coupled to a second carry clock line CRCK6.

A gate electrode of a thirty-first transistor may be coupled to the first QB node QBn, one electrode of the thirty-first transistor may be coupled to the first power line VSS1, and the other electrode of the thirty-first transistor may be coupled to the second Q node Q(n+1). In some embodiments, the thirty-first transistor may include two thirty-first sub-transistors T31$a$ and T31$b$ coupled in series. A gate electrode of the first-thirty-first sub-transistor T31$a$ may be coupled to the first QB node QBn, one electrode of the first-thirty-first sub-transistor T31$a$ may be coupled to the first power line VSS1, and the other electrode of the first-thirty-first sub-transistor T31$a$ may be coupled to a second node N2. A gate electrode of the second-thirty-first sub-transistor T31$b$ may be coupled to the first QB node QBn, one electrode of the second-thirty-first sub-transistor T31$b$ may be coupled to the second node N2, and the other electrode of the second-thirty-first sub-transistor T31$b$ may be coupled to the second Q node Q(n+1).

A gate electrode of a thirty-second transistor may be coupled to the second QB node QB(n+1), one electrode of the thirty-second transistor may be coupled to the first power line VSS1, and the other electrode of the thirty-second transistor may be coupled to the second Q node Q(n+1). In some embodiments, the thirty-second transistor may include two thirty-second sub-transistors T32a and T32b coupled in series. A gate electrode of the first-thirty-second sub-transistor T32a may be coupled to the second QB node QB(n+1), one electrode of the first-thirty-second sub-transistor T32a may be coupled to the first power line VSS1, and the other electrode of the first-thirty-second sub-transistor T32a may be coupled to the second node N2. A gate electrode of the second-thirty-second sub-transistor T32b may be coupled to the second QB node QB(n+1), one electrode of the second-thirty-second sub-transistor T32b may be coupled to the second node N2, and the other electrode of the second-thirty-second sub-transistor T32b may be coupled to the second Q node Q(n+1).

A gate electrode of a thirty-third transistor T33 may be coupled to the sixth control line CS6, one electrode of the thirty-third transistor T33 may be coupled to a gate electrode of a thirty-fourth transistor T34, and the other electrode of the thirty-third transistor T33 may be coupled to the sixth control line CS6.

The gate electrode of the thirty-fourth transistor T34 may be coupled to the one electrode of the thirty-third transistor T33, one electrode of the thirty-fourth transistor T34 may be coupled to the second QB node QB(n+1), and the other electrode of the thirty-fourth transistor T34 may be coupled to the sixth control line CS6.

A gate electrode of the thirty-fifth transistor T35 may be coupled to the first Q node Qn, and one electrode of the thirty-fifth transistor T35 may be coupled to the third power line VSS3, and the other electrode of the thirty-fifth transistor T35 may be coupled to the gate electrode of the thirty-fourth transistor T34.

A gate electrode of a thirty-sixth transistor T36 may be coupled to the second Q node Q(n+1), one electrode of the thirty-sixth transistor T36 may be coupled to the third power line VSS3, and the other electrode of the thirty-sixth transistor T36 may be coupled to the gate electrode of the thirty-fourth transistor T34.

A gate electrode of a thirty-seventh transistor T37 may be coupled to the first QB node QBn, one electrode of the thirty-seventh transistor T37 may be coupled to the first power line VSS1, and the other electrode of the thirty-seventh transistor T37 may be coupled to the second carry line CR(n+1).

A gate electrode of a thirty-eighth transistor T38 may be coupled to the second QB node QB(n+1), one electrode of the thirty-eighth transistor T38 may be coupled to the first power line VSS1, and the other electrode of the thirty-eighth transistor T38 may be coupled to the second carry line CR(n+1).

A gate electrode of a thirty-ninth transistor T39 may be coupled to the first QB node QBn, one electrode of the thirty-ninth transistor T39 may be coupled to the second power line VSS2, and the other electrode of the thirty-ninth transistor T39 may be coupled to the second sensing line SS(n+1).

A gate electrode of a fortieth transistor T40 may be coupled to the second QB node QB(n+1), one electrode of the fortieth transistor T40 may be coupled to the second power line VSS2, and the other electrode of the fortieth transistor T40 may be coupled to the second sensing line SS(n+1).

A gate electrode of a forty-first transistor T41 may be coupled to the first QB node QBn, one electrode of the forty-first transistor T41 may be coupled to the second power line VSS2, and the other electrode of the forty-first transistor T41 may be coupled to the second scan line SC(n+1).

A gate electrode of a forty-second transistor T42 may be coupled to the second QB node QB(n+1), one electrode of the forty-second transistor T42 may be coupled to the second power line VSS2, and the other electrode of the forty-second transistor T42 may be coupled to the second scan line SC(n+1).

A gate electrode of a forty-third transistor may be coupled to the first control line CS1, one electrode of the forty-third transistor may be coupled to a second sensing carry line CR(n−1), and the other electrode of the forty-third transistor may be coupled to the second node N2. For example, a carry signal output from the scan stage ST(n−1) may be applied to the second sensing carry line CR(n−1). In some embodiments, the forty-third transistor may include two forty-third sub-transistors T43a and T43b coupled in series. A gate electrode of the first-forty-third sub-transistor T43a may be coupled to the first control line CS1, one electrode of the first-forty-third sub-transistor T43a may be coupled to the second sensing carry line CR(n−1), and the other electrode of the first-forty-third sub-transistor T43a may be coupled to one electrode of the second-forty-third sub-transistor T43b. A gate electrode of the second-forty-third sub-transistor T43b may be coupled to the first control line CS1, the one electrode of the second-forty-third sub-transistor T43b may be coupled to the other electrode of the first-forty-third sub-transistor T43a, and the other electrode of the second-forty-third sub-transistor T43b may be coupled to a gate electrode of a forty-fifth transistor T45.

A gate electrode of a forty-fourth transistor T44 may be coupled to the third control line CS3, one electrode of the forty-fourth transistor T44 may be coupled to the second Q node Q(n+1), and the other electrode of the forty-fourth transistor T44 may be coupled to the second node N2.

The gate electrode of the forty-fifth transistor T45 may be coupled to the other electrode of the forty-third transistor, on electrode of the forty-fifth transistor T45 may be coupled to the second node N2, and the other electrode of the forty-fifth transistor T45 may be coupled to the second control line CS2.

One electrode of a sixth capacitor C6 may be coupled to the gate electrode of the forty-fifth transistor T45, and the other electrode of the sixth capacitor C6 may be coupled to the other electrode of the forty-fifth transistor T45.

One electrode of a forty-sixth transistor may be coupled to the second Q node Q(n+1), and a gate electrode and the other electrode of the forty-sixth transistor may be coupled to a second scan carry line CR(n−1). A carry signal output from the scan stage ST(n−1) may be applied to the second scan carry line CR(n−1). In some embodiment, the forty-sixth transistor may include two forty-sixth sub-transistors T46a and T46b coupled in series. A gate electrode of the first-forty-sixth sub-transistor T46a may be coupled to the second scan carry line CR(n−1), one electrode of the first-forty-sixth sub-transistor T46a may be coupled to the second Q node Q(n+1), and the other electrode of the first-forty-sixth sub-transistor T46a may be coupled to the second node N2. A gate electrode of the second-forty-sixth sub-transistor T46b may be coupled to the second scan carry line CR(n−1), one electrode of the second-forty-sixth sub-transistor T46b may be coupled to the second node N2, and the other electrode of the second-forty-sixth sub-transistor T46b may be coupled to the second scan carry line CR(n−1).

A gate electrode of a forty-seventh transistor T47 may be coupled to the second Q node Q(n+1), one electrode of the forty-seventh transistor T47 may be coupled to the second control line CS2, and the other electrode of the forty-seventh transistor T47 may be coupled to the second node N2.

A gate electrode of a forty-eighth transistor T48 may be coupled to the other electrode of the forty-third transistor, one electrode of the forty-eighth transistor T48 may be coupled to the first power line VSS1, and the other electrode of the forty-eighth transistor T48 may be coupled to one electrode of a forty-ninth transistor T49.

A gate electrode of the forty-ninth transistor T49 may be coupled to the third control line CS3, the one electrode of the forty-ninth transistor T49 may be coupled to the other electrode of the forty-eighth transistor T48, and the other electrode of the forty-ninth transistor T49 may be coupled to the second QB node QB(n+1).

A gate electrode of a fiftieth transistor T50 may be coupled to the second Q node Q(n+1), one electrode of the fiftieth transistor T50 may be coupled to the second QB node QB(n+1), and the other electrode of the fiftieth transistor T50 may be coupled to the first power line VSS1.

A gate electrode of a fifty-first transistor T51 may be coupled to the first scan carry line CR(n−3), one electrode of the fifty-first transistor T51 may be coupled to the second QB node QB(n+1), and the other electrode of the fifty-first transistor T51 may be coupled to the first power line VSS1.

A gate electrode of a fifty-second transistor may be coupled to the fourth control line CS4, one electrode of the fifty-second transistor may be coupled to the first power line VSS1, and the other electrode of the fifty-second transistor may be coupled to the second Q node Q(n+1). In some embodiments, the fifty-second transistor may include two fifty-second sub-transistors T52a and T52b coupled in series. A gate electrode of the first-fifty-second sub-transistor T52a may be coupled to the fourth control line, one electrode of the first-fifty-second sub-transistor T52a may be coupled to the first power line VSS1, and the other electrode of the first-fifty-second sub-transistor T52a may be coupled to the second node N2. A gate electrode of the second-fifty-second sub-transistor T52b may be coupled to the fourth control line CS4, one electrode of the sub-transistor T52b may be coupled to the second node N2, and the other electrode of the second-fifty-second sub-transistor T52b may be coupled to the second Q node Q(n+1).

A gate electrode of a fifty-third transistor may be coupled to the first reset carry line CR(n+4), one electrode of the fifty-third transistor may be coupled to the first power line VSS1, and the other electrode of the fifty-third transistor may be coupled to the second Q node Q(n+1). In some embodiments, the fifty-third transistor may include two fifty-third sub-transistors T53a and T53b coupled in series. A gate electrode of the first-fifty-third sub-transistor T53a may be coupled to the first reset carry line CR(n+4), one electrode of the first-fifty-third sub-transistor T53a may be coupled to the first power line VSS1, and the other electrode of the first-fifty-third sub-transistor T53a may be coupled to the second nod N2. A gate electrode of the second-fifty-third sub-transistor T53b may be coupled to the first reset carry line CR(n+4), one electrode of the second-fifty-third sub-transistor T53b may be coupled to the second node N2, and the other electrode of the second-fifty-third sub-transistor T53b may be coupled to the second Q node Q(n+1).

A gate electrode of a fifty-fourth transistor T54 may be coupled to the other electrode of the second-forty-third sub-transistor T43b, one electrode of the fifty-fourth transistor T54 may be coupled to the second control line CS2, and the other electrode of the fifty-fourth transistor T54 may be coupled to the one electrode of the second-forty-third sub-transistor T43b.

Figure 5:
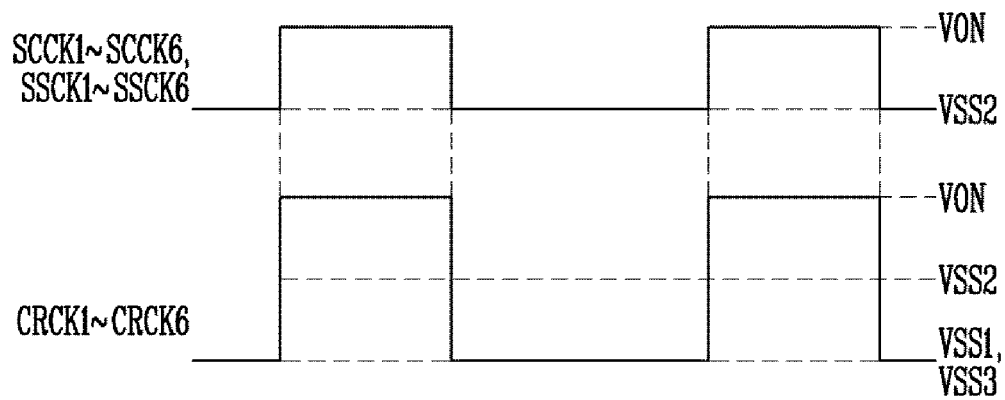
FIG. 5 is a diagram illustrating an example of voltage levels of the clock signals shown in FIG. 4.

FIGS. 4 and 5 are diagrams illustrating a driving method of the scan driver shown in FIG. 3 in the display period. To be specific, FIG. 4 is an exemplary timing diagram illustrating an example of an operation in the display period of the first scan stage and the second scan stage shown in FIG. 3, and FIG. 5 is a diagram illustrating an example of voltage levels of the clock signals shown in FIG. 4.

Referring to FIG. 4, signals are illustrated, which are applied to the first control line CS1, the fourth control line CS4, the scan clock lines SCCK1 to SCCK6, the sensing clock lines SSCK1 to SSCK6, the carry clock lines CRCK1 to CRCK6, the first scan carry line CR(n−3), the first sensing carry line CR(n−2), the first scan line SCn, the second scan line SC(n+1), the first sensing line SSn, the second sensing line SS(n+1), the first carry line CRn, and the second carry line CR(n+1).

In the display period, phases of a scan clock signal, a sensing clock signal, and a carry clock signal, which are respectively applied to a scan clock line, a sensing clock line, and a carry clock line, which are coupled to the same scan stage, may be equal to one another. Therefore, in FIG. 4, a signal of the first clock lines SCCK1, SSCK1, and CRCK1 is commonly illustrated, a signal of the second clock lines SCCK2, SSCK2, and CRCK2 is commonly illustrated, a signal of the third clock lines SCCK3, SSCK3, and CRCK3 is commonly illustrated, a signal of the fourth clock lines SCCK4, SSCK4, and CRCK4 is commonly illustrated, a signal of the fifth clock lines SCCK5, SSCK5, and CRCK5 is commonly illustrated, and a signal of the sixth clock lines SCCK6, SSCK6, and CRCK6 is commonly illustrated.

However, referring to FIG. 5, magnitudes of the scan clock signal, the sensing clock signal, and the carry clock signal, which are respectively applied to the scan clock line, the sensing clock line, and the carry clock line, which are coupled to the same scan stage, may be different from one another. For example, a low level of the scan clock signals and the sensing clock signals may correspond to the magnitude of a voltage applied to the second power line VSS2, and a high level of the scan clock signals and the sensing clock signals may correspond to the magnitude of a turn-on voltage VON. In addition, a low level of the carry clock signals may correspond to the magnitude of a voltage applied to the first power line VSS1 or the third power line VSS3, and a high level of the carry clock signals may correspond to the magnitude of the turn-on voltage VON. For example, the voltage applied to the second power line VSS2 may be larger than that applied to the first power line VSS1 or the third power line VSS3.

The magnitude of the turn-on voltage VON may be a magnitude sufficient enough to turn on the transistors, and the magnitude of each of the voltages applied to the first, second, and third power lines VSS1, VSS2, and VSS3 may be a magnitude sufficient enough to turn off the transistors. Hereinafter, a voltage level corresponding to the magnitude of the turn-on voltage VON may be expressed as the high level, and a voltage level corresponding to the magnitude of each of the voltages applied to the first to third power lines VSS1, VSS2, and VSS3 may be expressed as the low level.

Referring back to FIG. 4, high-level pulses of the second clock lines SCCK2, SSCK2, and CRCK2 have a phase delayed from those of the first clock lines SCCK1, SSCK1, and CRCK1, and the high-level pulses of the second clock lines SCCK2, SSCK2, and CRCK2 and the high-level pulses of the first clock lines SCCK1, SSCK1, and CRCK1 may temporally partially overlap with each other. For example, the high-level pulses may have a length of two horizontal periods, and the overlapping length may correspond to one horizontal period.

Similarly, high-level pulses of the third clock lines SCCK3, SSCK3, and CRCK3 have a phase delayed from those of the second clock lines SCCK2, SSCK2, and CRCK2, and the high-level pulses of the third clock lines SCCK3, SSCK3, and CRCK3 and the high-level pulses of the second clock lines SCCK2, SSCK2, and CRCK2 may temporally partially overlap with each other. High-level pulses of the fourth clock lines SCCK4, SSCK4, and CRCK4 have a phase delayed from those of the third clock lines SCCK3, SSCK3, and CRCK3, and the high-level pulses of the fourth clock lines SCCK4, SSCK4, and CRCK4 and the high-level pulses of the third clock lines SCCK3, SSCK3, and CRCK3 may temporally partially overlap with each other. High-level pulses of the fifth clock lines SCCK5, SSCK5, and CRCK5 have a phase delayed from those of the fourth clock lines SCCK4, SSCK4, and CRCK4, and the high-level pulses of the fifth clock lines SCCK5, SSCK5, and CRCK5 and the high-level pulses of the clock lines fourth SCCK4, SSCK4, and CRCK4 may temporally partially overlap with each other. High-level pulses of the sixth clock lines SCCK6, SSCK6, and CRCK6 have a phase delayed from those of the fifth clock lines SCCK5, SSCK5, and CRCK5, and the high-level pulses of the sixth clock lines SCCK6, SSCK6, and CRCK6 and the high-level pulses of the fifth clock lines SCCK5, SSCK5, and CRCK5 may temporally partially overlap with each other. In addition, iteratively, the high-level pulses of the first clock lines SCCK1, SSCK1, and CRCK1 have a phase delayed from those of the sixth clock lines SCCK6, SSCK6, and CRCK6, and the high-level pulses of the first clock lines SCCK1, SSCK1, and CRCK1 and the high-level pulses of the sixth clock lines SCCK6, SSCK6, and CRCK6 may temporally partially overlap with each other.

Hereinafter, an operation of the first scan stage STn in the display period will be described as referring to FIGS. 3, 4, and 5. Operations of the other scan stages are similar to that of the first scan stage STn, and therefore, repetitive descriptions will be omitted to avoid redundancy.

First, a high-level pulse may be applied to the fourth control line CS4. Therefore, the eighteenth transistor including two eighteenth sub-transistors T18a and T18b is turned on, and the first Q node Qn is discharged to the low level.

After a certain time elapses, at a first time point t1, a high-level pulse is applied to the first scan carry line CR(n−3). Accordingly, the second transistor including two second sub-transistors T2a and T2b is turned on, and the first Q node Qn is charged to the high level. The sixth transistor T6 may be turned on, and the first node N1 may be charged to the high level applied to the second control line CS2.

Next, at a second time point t2, a high-level pulse is applied to the first control line CS1, and therefore, the third transistor including two third sub-transistors T3a and T3b may be turned on. Since a high-level pulse is generated in the first sensing carry line CR(n−2), a high-level voltage may be charged in the other electrode of the capacitor C1 through the turn-on third transistor.

Next, at a third time point t3, since a high-level pulse is applied to the fifth clock lines SCCK5, SSCK5, and CRCK5, a voltage of the first Q node Qn is boosted higher than the high level, and a high-level pulse is output to the scan line SCn, the sensing line SSn, and the carry line CRn.

Although the voltage of the first Q node Qn is boosted, a high-level voltage is applied to the first node N1, and therefore, voltage differences between drain and source electrodes of each of the transistors T5, T2b, T18a, T9a, T11a, and T10a are not relatively large. Thus, degradation of the transistors T5, T2b, T18a, T9a, T11a, and T10a can be minimized or prevented.

In a similar manner, when a high-level pulse is applied to the sixth clock lines SCCK6, SSCK6, and CRCK6, a high-level pulse is output to the scan line SC(n+1), the sensing line SS(n+1), and the carry line CR(n+1).

Furthermore, in an embodiment, although not shown in FIG. 4, when a high-level pulse is applied through the first reset carry line CR(n+4), the first Q node Qn is coupled to the first power line VSS1 through the ninth transistor, to be discharged to the low level.

In addition, a high-level control signal may be applied alternately to the fifth control line CS5 and the sixth control line CS6 in a specific period unit. For example, the specific period unit may correspond to a period including several frames, and may include a first period and a second period next to the first period.

For example, during the first period, a high-level control signal may be applied to the fifth control line CS5, and a low-level control signal may be applied to the sixth control line CS6. The transistors T23 and T24 are turned on, so that the first QB node QBn can be charged to the high level. Thus, the tenth transistor is turned on, so that the first Q node Qn can be discharged to the low level. In addition, the twelfth transistor T12 is turned on, so that the first carry line CRn can be discharged to the low level. In addition, the fourteenth transistor is turned on, so that the first sensing line SSn can be discharged to the low level. In addition, the sixteenth transistor T16 is turned on, so that the first scan line SCn can be discharged to the low level.

During the second period next to the first period, a low-level control signal may be applied to the fifth control line CS5, and a high-level control signal may be applied to the sixth control lien CS6. The transistors T33 and T34 are turned on, so that the second QB node QB(n+1) can be charged to the high level. Thus, the eleventh transistor is turned on, so that the first Q node Qn can be discharged to the low level. In addition, the thirteenth transistor T13 is turned on, so that the first carry line CRn can be discharged to the low level. In addition, the fifteenth transistor T15 is turned on, so that the first sensing line SSn can be discharged to the low level. In addition, the seventeenth transistor T17 is turned on, so that the first scan line SCn can be discharged to the low level.

Accordingly, the period in which an on-bias is applied to the transistors used during the first period and the second period can be shortened, and thus degradation of the transistors which are included in the scan driver can be minimized or prevented.

Figure 6:
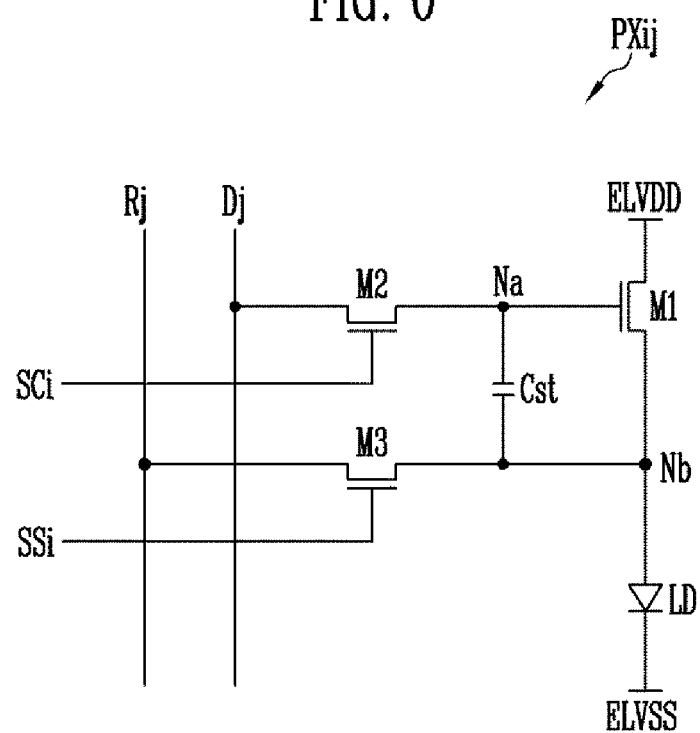
FIG. 6 is a circuit diagram of a representative pixel of the display device of FIG. 1.

FIG. 6 is a circuit diagram of a representative pixel of the display device of FIG. 1.

Referring to FIG. 6, the pixel PXij may include pixel transistors M1, M2, and M3, a storage capacitor Cst, and a light emitting device LD. The pixel transistors M1, M2, and M3 may be N-type transistors.

First pixel transistor M1 may have a gate electrode coupled to a node Na, one electrode coupled to a power line ELVDD, and the other electrode coupled to the node Nb. The first pixel transistor M1 may be referred to as a driving transistor.

Second pixel transistor M2 may have a gate electrode coupled to a scan line SCi, one electrode coupled to a data line Dj, and the other electrode coupled to the node Na. The second pixel transistor M2 may be referred to as a switching transistor, scan transistor or the like.

Third pixel transistor M3 may have a gate electrode coupled to a sensing line SSi, one electrode coupled to a receiving line Rj, and the other electrode coupled to the node Nb. The third pixel transistor M3 may be referred to as an initialization transistor, sensing transistor or the like.

One electrode of the storage capacitor Cst may be coupled to the node Na, and the other electrode of the storage capacitor Cst may be coupled to the node Nb.

An anode of the light emitting device LD may be coupled to the node Nb, and a cathode of the light emitting device LD may be coupled to the power line ELVSS. The light emitting device LD may be configured with an organic light emitting diode, an inorganic light emitting diode, etc.

Referring to FIG. 6, a high-level pulse may be applied to the scan line SCi and the sensing line SSi at least once during a display period of one frame. A corresponding data signal is in a state in which it is applied to the data line Dj, and a first reference voltage is in a state in which it is applied to the receiving line Rj. Therefore, the storage capacitor Cst may store a voltage corresponding to the difference between the data signal and the first reference voltage during a state in which the transistors M2 and M3 are turned on. Subsequently, the transistors M2 and M3 are turned off, an amount of driving current flowing through the transistor M1 is determined corresponding to the voltage stored in the storage capacitor Cst, and the light emitting device LD emits light.

FIG. 7 is an exemplary timing diagram illustrating an example of an operation in a sensing period of the first scan stage and the second scan stage shown in FIG. 3.

Referring to FIG. 7, signals are illustrated, which are applied to the third control line CS3, the scan clock lines SCCK1 to SCCK6, the sensing clock lines SSCK1 to SSCK6, the carry clock lines CRCK1 to CRCK6, the scan lines SCn and SC(n+1), the sensing lines SSn and SS(n+1), and the carry lines CRn and CR(n+1).

At a fourth time point t4, a high-level pulse may be applied to the third control line CS3. Accordingly, the fifth transistor T5 may be turned on. Since the first capacitor C1 is in a state in which it is charged with a voltage during the above-described during the second time point t2 and the third time point t3, the fourth transistor T4 may be in a turn-on state. Accordingly, the high-level voltage applied to the second control line CS2 may be applied to the first Q node Qn through the transistors T4 and T5.

In each of the other scan stages such as ST(n−4), ST(n−3), ST(n−2), ST(n−1), ST(n+1), ST(n+2), ST(n+3), ST(n+4), ST(n+5) except the first scan stage STn, a fourth transistor T4 and a forty-fifth transistor T45 are in a turn-off state, and hence a first Q node and a second Q node may maintain the low level. A fifth transistor T5 and a forty-fourth transistor T44 may be in the turn-on state. Thus, first node N1 and second node N2 of each of the other scan stages except the first scan stage STn are respectively to the first Q node and the second Q node, to be discharged to the low level. Accordingly, when the first Q node and the second Q node are boosted to a level higher than the high level, transistors between the first node and the first Q node and transistors between the second node and the second Q node may be degraded due to a high voltage difference between drain and source electrodes. However, in order to solve this problem, in the embodiment, a sixth transistor T6 is provided to change the level of a voltage of the first node to the high level, corresponding to the boosting of the first Q node, and a forty-seventh transistor T47 is provided to change the level of a voltage of the second node to the high level, corresponding to the boosting of the second Q node, thereby solving this problem.

Next, at a fifth time point t5, a high-level signal may be applied to the fifth scan clock line SCCK5 and the fifth sensing clock line SSCK5. Hence, the voltage of the first Q node Qn is boosted by the capacitors C2 and C3, and a high-level signal may be output to the first scan line SCn and the first sensing line SSn.

Therefore, the second and third pixel transistors M2 and M3 of pixels coupled to the first scan line SCn and the first sensing line SSn may be turned on. A second reference voltage may be applied to the data lines. The sensing unit 14 may measure degradation information or characteristic information of the pixels according to current values or voltage values received through receiving lines Rj, . . . .

In the other scan stages except the first scan stage STn, nodes corresponding to the first Q node or the second Q node have the low level. Hence, although a low-level signal may be output to corresponding scan lines and corresponding sensing lines, in spite of high-level pulses applied to the scan clock lines SCCK1 to SCCK6 and the sensing clock lines SSCK1 to SSCK6. For example, a low-level signal may be output from the second scan line SC(n+1) and the second sensing line SS(n+1).

At a sixth time point t6, a high-level signal may be applied to the scan clock lines SCCK1 to SCCK6 and the sensing clock lines SSCK1 to SSCK6. Data signals at the time just prior to the time t6 may be re-applied to the data lines. Thus, the pixels coupled to the first scan line SCn and the first sensing line SSn may light with grayscales based on the data signals at the time just prior to the time t6.

According to the illustrated embodiment, during the fifth time point t5 and the sixth time point t6, the pixels coupled to the first scan line SCn and the first sensing line SSn do not emit lights with grayscales based on the data signals. However, after the sixth time point t6, the pixels coupled to the first scan line SCn and the first sensing line SSn re-emit lights with grayscales based on the data signals, and pixels coupled to other scan lines and other sensing lines continuously emit lights with grayscales based on the data signals during the sensing period. Thus, there is no problem in that a viewer recognizes a frame.

Figure 8:
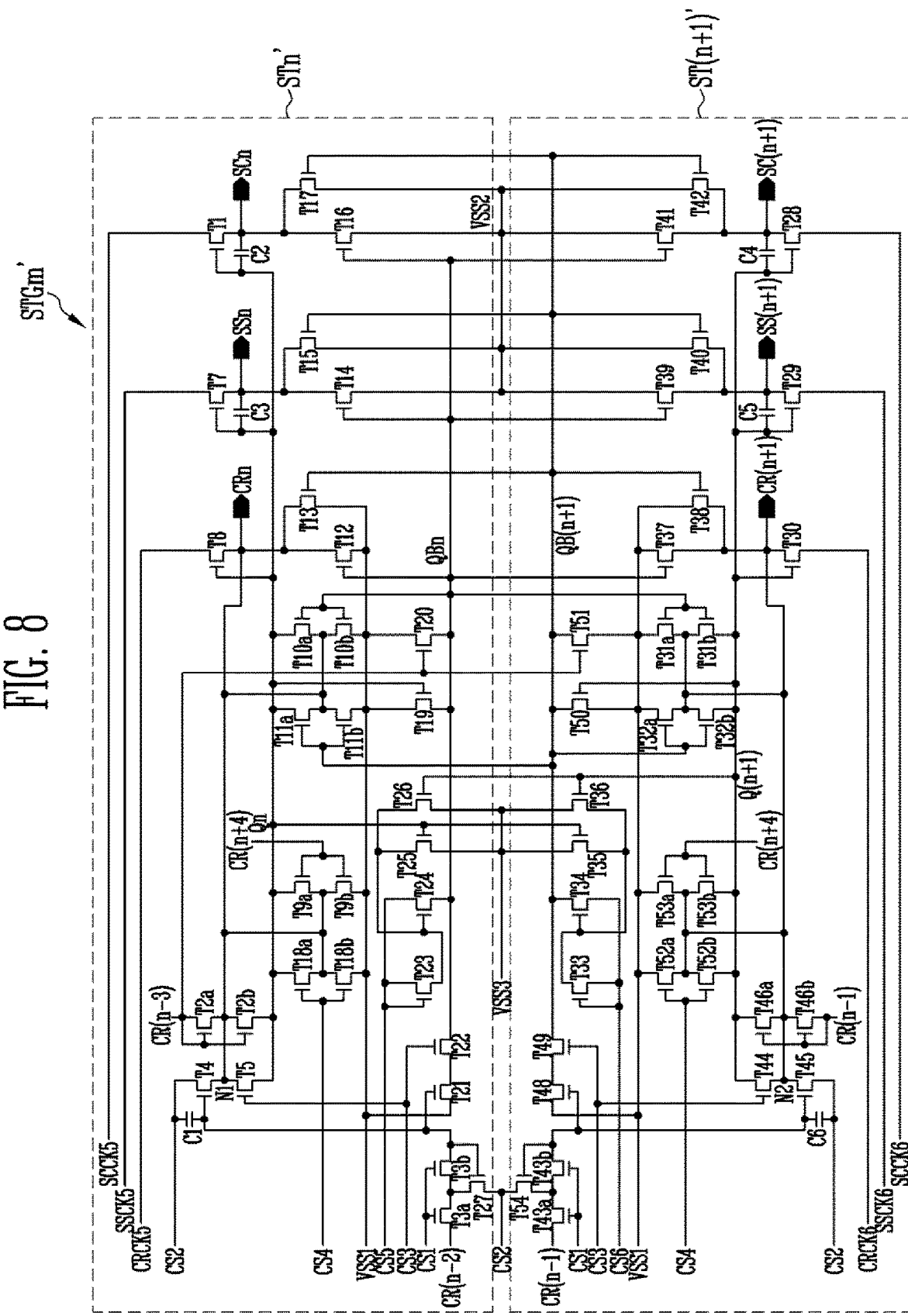
FIG. 8 is a circuit diagram of another embodiment of a first scan stage and a second scan stage included in a stage group of the scan driver shown in FIG. 2.

FIG. 8 is a circuit diagram of another embodiment of a first scan stage and a second scan stage included in a stage group of the scan driver shown in FIG. 2.

Referring to FIG. 8, a stage group STGm' may include a first scan stage STn' and a second scan stage ST(n+1)'.

In the first scan stage STn' shown in FIG. 8, the sixth transistor T6 does not exist as compared with the first scan stage STn shown in FIG. 3. Instead, the first node N1 is coupled to the first carry line CRn.

Thus, when the first Q node Qn is boosted to a voltage higher than the high level, a high-level carry signal is applied to the first node N1. Accordingly, degradation of the transistors T5, T2*b*, T18*a*, T9*a*, T11*a*, and T10*a* due to a transient voltage difference between drain and source electrodes of each of the transistors T5, T2*b*, T18*a*, T9*a*, T11*a*, and T10*a* can be minimized or prevented.

In addition, in the second scan stage ST(n+1)' shown in FIG. 8, the forty-seventh transistor T47 does not exist as compared with the second scan stage ST(n+1) shown in FIG. 3. Instead, the second node N2 is coupled to the second carry line CR(n+1).

Thus, when the second Q node Q(n+1) is boosted to a voltage higher than the high level, a high-level carry signal is applied to the second node N2. Accordingly, degradation of the transistors T44, T46a, T52b, T53b, T32b, and T31b due to a transient voltage difference between drain and source electrodes of each of the transistors T44, T46a, T52b, T53b, T32b, and T31b can be prevented.

According to the embodiments, the scan driver can selectively provide a scan signal and reduce or prevent degradation of transistors.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A scan driver for a display device comprising:
    a plurality of scan stage groups, each of the scan stage groups including a first scan stage and a second scan stage,
    wherein the first scan stage comprises:
    a first transistor including a gate electrode coupled to a first Q node, one electrode coupled to a first scan clock line, and another electrode coupled to a first scan line;
    a second transistor including a gate electrode and one electrode, which are coupled to a first scan carry line, and another electrode coupled to the first Q node;
    a third transistor including a gate electrode coupled to a first control line and one electrode coupled to a first sensing carry line;
    a fourth transistor including a gate electrode coupled to an other electrode of the third transistor, one electrode coupled to a second control line, and another electrode coupled to a first node;
    a first capacitor including one electrode coupled to the one electrode of the fourth transistor and another electrode coupled to the gate electrode of the fourth transistor; and
    a fifth transistor including a gate electrode coupled to a third control line, one electrode coupled to the first node, and another electrode coupled to the first Q node,
    wherein the first node is directly coupled to a first carry line.

* * * * *